United States Patent [19]

Whitley

[11] 4,325,040
[45] Apr. 13, 1982

[54] APPARATUS FOR AUTOMATIC ADJUSTMENT OF AN INDUCTOR IN A TUNED CIRCUIT

[75] Inventor: George J. Whitley, Philadelphia, Pa.

[73] Assignee: RCA Corporation, New York, N.Y.

[21] Appl. No.: 210,789

[22] Filed: Nov. 26, 1980

[51] Int. Cl.³ .................................................. H03J 3/00
[52] U.S. Cl. ...................................... 334/17; 334/71; 336/20; 336/30
[58] Field of Search ...................... 336/20, 30; 334/17, 334/71, 20, 21, 22

[56] References Cited

FOREIGN PATENT DOCUMENTS 162029 1/1949 Austria .................................. 336/20

Primary Examiner—Thomas J. Kozma
Attorney, Agent, or Firm—Paul J. Rasmussen; Peter M. Emanuel; Allan J. Jacobson

[57] ABSTRACT

Disclosed is an apparatus for adjusting an inductor that is mounted on a circuit board. The inductor is of the type comprising two extensible sections connected at one respective end to the circuit board and connected at the other respective end by a connecting portion integral to the inductor. The electrical value of the inductor is adjusted by mechanically engaging the connecting portion between first and second push rods and moving the connecting portion so as to simultaneously extend or compress the two extensible sections. The first push rod extends through an opening in the circuit board to apply mechanical force against the connecting portion and the second push rod extends from above the circuit board so as to clamp the connecting portion between the first and second push rods. In one embodiment, the linear displacement of the first push rod is controllable to selectively advance or retract the first push rod, while the second push rod exerts a substantially constant force sufficient to collapse the two extensible sections of the inductor to the extent permitted by the linear displacement of the first push rod.

6 Claims, 7 Drawing Figures

APPARATUS FOR AUTOMATIC ADJUSTMENT OF AN INDUCTOR IN A TUNED CIRCUIT

FIELD OF THE INVENTION

This invention pertains to apparatus for automatically adjusting an inductor in a tuned circuit.

BACKGROUND OF THE INVENTION

An adjustable inductor contemplated to be adjusted by the present invention is described in a copending patent application Ser. No. 210,745 by R. Evans entitled "Inductor Arrangement Suitable For Automatic Adjustment," filed concurrently herewith and assigned to the assignee of the present invention.

An embodiment of the inductor disclosed in the above-referenced patent application comprises first and second extensible inductive coils and a connecting portion therebetween. Each coil is attached at one respective end to a circuit board. The other ends of the coils are joined by the connecting portion. The electrical value of the inductor is adjusted by mechanically engaging and moving the connecting portion to simultaneously extend or compress the first and second inductive coils. The circuit board on which the inductor is mounted is provided with an opening below the connecting portion between the coils.

SUMMARY OF THE INVENTION

The present invention is directed towards apparatus for mechanically engaging the inductor from above and below the connecting portion thereof. Specifically, a first means extending through the opening in the circuit board is provided for exerting mechanical force against the connecting portion of the inductor. A second means is provided for exerting mechanical force against the connecting portion in a direction opposite to that of the first means so as to clamp the connecting portion between the first and second means. Control means, connected to the first and second means, is provided for moving the connecting portion so as to simultaneously extend or compress the extensible sections of the inductor.

DETAILED DESCRIPTION

Figure 1:
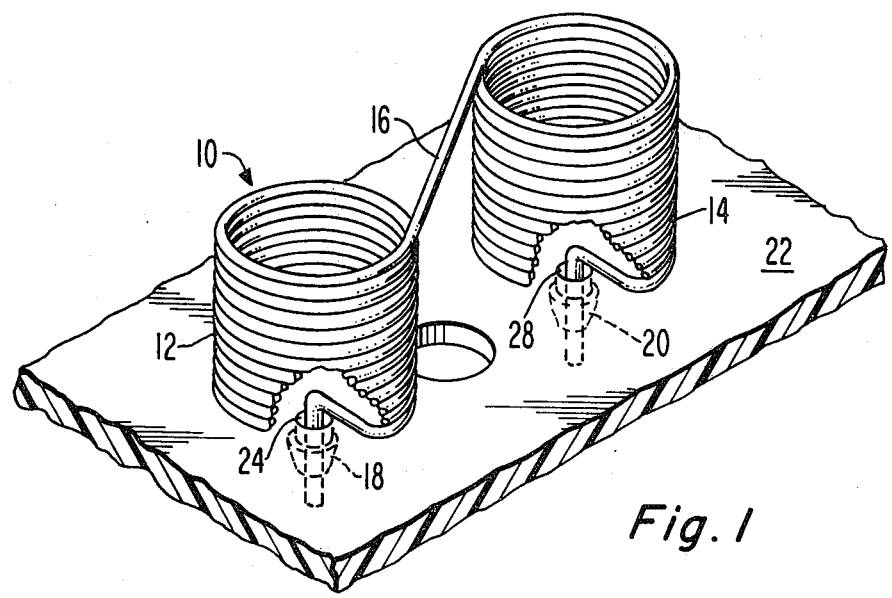
FIG. 1 is an isometric view of an inductor arrangement suitable for use with the present invention.

FIG. 1 shows an inductor 10 comprising a continuous wire formed in the shape of a first helical coil 12, a second helical coil 14, and a linear, spaced connecting portion 16 between the two helical coils 12 and 14. The inductor 10 can be formed by bending a single helical coil at its midpoint to form two parallel helical coils, and unrolling a portion of a turn, or more, to form the linear, spaced connecting portion 16. The two ends 18 and 20 of the respective helical coils 12 and 14 pass through respective holes 24 and 28 of circuit board 22 and are soldered to respective conductor paths, e.g., for connecting inductor 10 in a tuned circuit (not shown). The wire forming inductor 10 is insulated over its length, except for the ends 18 and 20 in contact with circuit board 22, with a suitable insulating material, such as enamel. As shown, the axis of coils 12 and 14 are substantially perpendicular to the surface of circuit board 22 and the connecting portion 16 is substantially parallel to the surface of circuit board 22.

The electrical inductance value of the inductor 10 is adjusted by mechanically engaging the connecting portion 16 and exerting a force perpendicular to the circuit board 22 in a vertical direction so as to simultaneously expand or compress the first and second helical coils 12 and 14. As described in conjunction with the adjustment apparatus of FIG. 4, a hole 26 is provided in circuit board 22 beneath the connecting portion 16 to conveniently permit mechanically engaging connection portion 16 from below.

When the coil 10 is expanded, the two helical sections 12 and 14 tend to somewhat rotate the connecting member 16 in a plane parallel to the plane at circuit board 22. However, as a result of the symmetry of the inductor 10, the connecting member 16 will tend to remain in position vertically above the hole 26 and will tend to remain in a plane parallel to the plane of the circuit board 22. This feature permits the connecting portion 16 of the coil 10 to be conveniently mechanically engaged regardless of the state of extension or compression of the coil 10. Furthermore, the wire gauge is chosen so that the rigidity of the structure formed by the two helical coils 12 and 14 in conjunction with the connecting portion 16 is sufficient to form a self-supporting structure capable of retaining its inductance value after adjustment.

As the inductor 10 is expanded under stress, its inductance becomes smaller. At any given point of displacement, if the stress is removed (hereinafter referred to as the unstressed condition), the inductor 10 will return to a higher inductance value.

Figure 2:
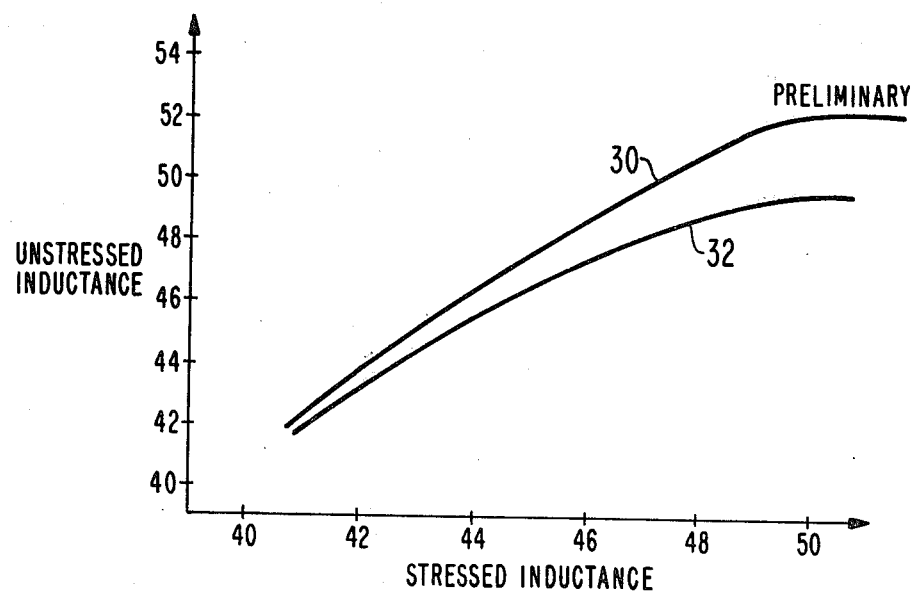
FIG. 2 is a graphical representation of inductance in a stressed condition as a function of inductance in an unstressed condition of an inductor constructed in accordance with an aspect of the present invention.

FIG. 2 illustrates the relationship between stressed and unstressed inductance for an inductor comprising two helical coils of 2.5 turns each wound with gauge 24 enameled wire. The horizontal axis represents inductance when the coils are stressed and the vertical axis represents inductance when the coils are released.

The curve 30 illustrates the stressed versus unstressed inductance for the preliminary, or first time that the inductor 10 is expanded. During such first expansion, the material of the inductor 10 is stressed beyond its modulus of elasticity. Thus, after the coil is collapsed, it does not quite return to its initial position.

The curve 32 illustrates the stressed versus unstressed inductance characteristic for the second and subsequent expansions of the inductor 10. That is, the first time the coil is stretched, its inductance return, or hysteresis is illustrated by curve 30. After the first expansion and collapse, the relationship between stressed and unstressed inductance is substantially repeatable for a given coil and is illustrated by curve 32. The inductor 10 thus exhibits a characteristic "hysteresis" between stressed and unstressed states that is a non-linear function of coil displacement.

Figure 3:
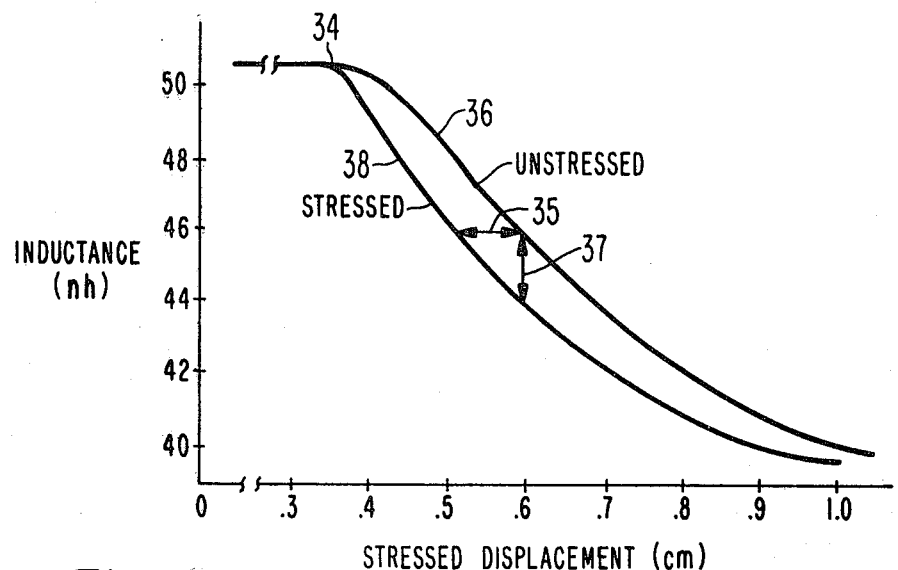
FIG. 3 shows graphical representations of inductance in stressed and unstressed conditions as a function of stressed displacement of an inductor constructed in accordance with an aspect of the present invention.

FIG. 3 graphically illustrates the repeatable inductance hysteresis as a function of displacement from the circuit board after a preliminary cycle of expansion and collapse. The horizontal axis represents displacement of inductor 10 under stress. The vertical axis represents inductance. The curve 38 illustrates inductance versus displacement for a stressed inductor. The curve 36 illustrates inductance versus displacement for an unstressed inductor. The vertical difference 37 between the stressed curve 38 and the unstressed curve 36 is the characteristic inductance hysteresis of the inductor 10.

As shown by curves 36 and 38 in the graph in FIG. 3, the inductance of the coil begins to change at point 34 where the connecting portion is first contacted by the adjustment apparatus, which point, by way of example, corresponds to a distance of approximately 0.35 centimeter (cm) from the surface of the circuit board. As the coil is stressed by applying additional displacement, the curve 38 illustrates the resulting decreasing value of inductance. At any given displacement, if the stress is released, the inductance increases, as indicated by curve 36. For example, if the inductor is displaced to 0.6 cm the inductance will be 44 nanohenrys (nH). Upon release, the inductor will return to an unstressed condition having an inductance of 46 nH. Conversely, if an unstressed inductance of 46 nH is desired, the inductor is first stressed to 0.6 cm and then released. The repeatable hysteresis characteristic of the inductor 10 may be used during adjustment to predict the resulting unstressed inductance corresponding to a given coil displacement under stress.

Figure 4:
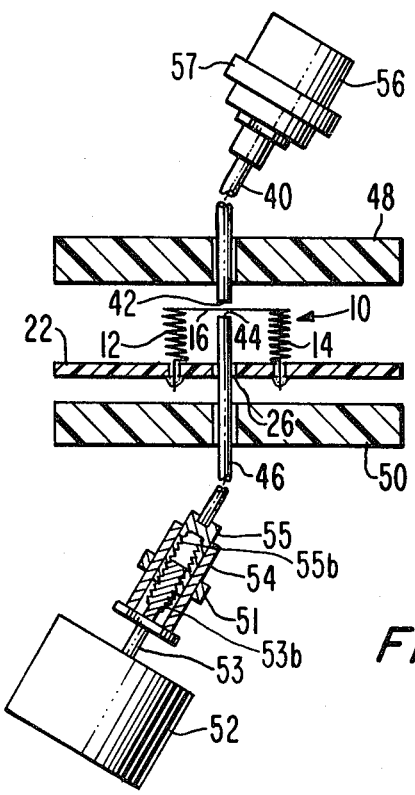
FIG. 4 is an assembly diagram, partially in cutaway form, illustrating an apparatus constructed in accordance with the present invention, for adjusting an inductor embodied in a tuned circuit.

FIG. 4 illustrates a system for mechanically adjusting the inductor 10 after it is mounted on a circuit board 22. A stepping motor 52 is responsive to control pulses to provide rotational motion at its output shaft 53. The output shaft 53 of the stepping motor 52 is connected to a screw advance mechanism 54 (shown in partial cutaway form to illustrate internal details) for converting the rotational motion provided by stepping motor 52 into linear motion at the output coupler 55. Specifically, shaft 53 is coupled to a threaded shaft 53b inside the housing of the screw advance mechanism 54. The interior of the output coupler 55 is formed with screw threads 55b for engaging the screw threads of the threaded shaft 53b. The output coupler 55 is keyed (not shown) to the housing of the screw advance mechanism 54 so as to permit linear motion, but to prevent rotational motion of the output coupler relative to the housing of the screw advance mechanism 54.

A clamp 51 holds the screw advance mechanism 54 in place, i.e. preventing linear or rotational movement. The output coupler 55 connects to a first push rod 46 which extends through guide member 50 and then through an opening 26 in the circuit board 22 beneath the inductor 10. The push rod 46, which may be rigid or flexible, has a notch 44 at the end thereof for mechanically engaging the underpart of the connecting portion 16 of the coil 10.

A second push rod 40, which is similar to the first push rod 46, extends through a guide member 48 and has a notch 42 at its end for mechanically engaging the connecting portion 16 from above.

The second push rod 40 is connected to an electrically controlled pneumatic air cylinder 56 which is responsive to a control signal for selectively advancing or retracting the second push rod 40. The double acting air cylinder 56 is of a type similar to Model No. 061-D available from Bimba Corporation, Monee, Illinois. A clamp 57 holds the air cylinder 56 in place. When retracted, the second push rod 40 is withdrawn from any engagement with the inductor 10. When advanced, the second push rod 40 engages the inductor 10 and exerts a substantially constant downward force on the connecting portion 16 sufficient to collapse the two helical coils 12 and 14 to the extent permitted by the linear position of the first push rod 46.

In operation, the stepping motor 52 receives control pulses to provide rotational motion to the threaded shaft 53a of screw advanced mechanism 54. The screw threads of the threaded shaft 53a engage the screw threads 55a of the output coupler 55 to provide a linear motion which advances push rod 46 upward so as to mechanically engage and thereafter expand the coils 12 and 14 of inductor 10. In order to collapse the coils of the inductor 10, the air cylinder 56 advances the second push rod 40 to engage the connecting portion 16 of the inductor 10 between the two push rods 40 and 46. The stepping motor 52 then receives control pulses to provide rotational motion to the threaded shaft 53a of the screw advance mechanism 54 in the reverse direction which moves push rod 46 downward allowing the force exerted by push rod 40 to collapse the coils 12 and 14 of inductor 10 to a position determined by push rod 46.

Figure 5:
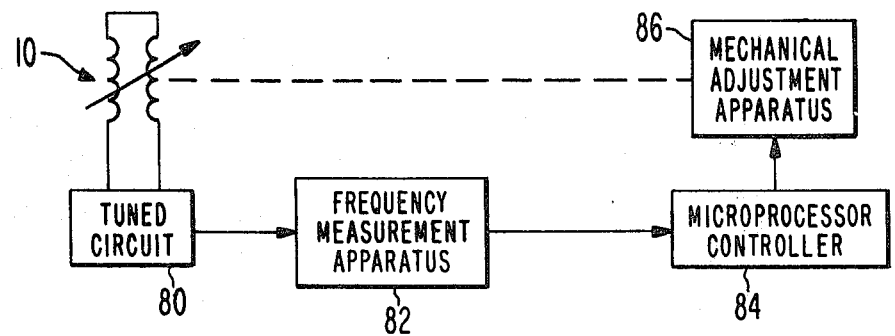
FIG. 5 is a block diagram of a system for automatically adjusting the frequency of a tuned circuit embodying an inductor arrangement suitable for use with the present invention.

FIG. 5 is a block diagram of a system for controlling the adjustment apparatus of FIG. 4. Inductor 10 is connected as part of a tuned circuit 80. A frequency measurement apparatus 82 is responsive to the tuned circuit for determining its frequency response characteristics. The frequency response of the tuned circuit is measured by apparatus 82 and fed to a controller 84, which may for example be a computer or microprocessor. The controller 84 provides appropriate signals to control the mechanical adjustment apparatus 86, i.e. control pulses to stepping motor 52 and a control signal to air cylinder 56 in FIG. 4, so as to mechanically adjust coil 10 to a desired value.

The adjustable inductor 10 may be combined in series with a fixed inductor (not shown). Such arrangement permits the full adjustment range of inductor 10 to be utilized, which also means that the adjustment of total inductance is less sensitive to the mechanical adjustment of inductor 10 and therefore less critical. Furthermore, utilizing such series arrangements, when two or more separate inductors are to be mounted on circuit board 22, the fixed portion of one inductor may be mounted at right angles to the fixed portion of the other inductor in order to reduce the interaction of their respective electromagnetic fields.

Figure 6:
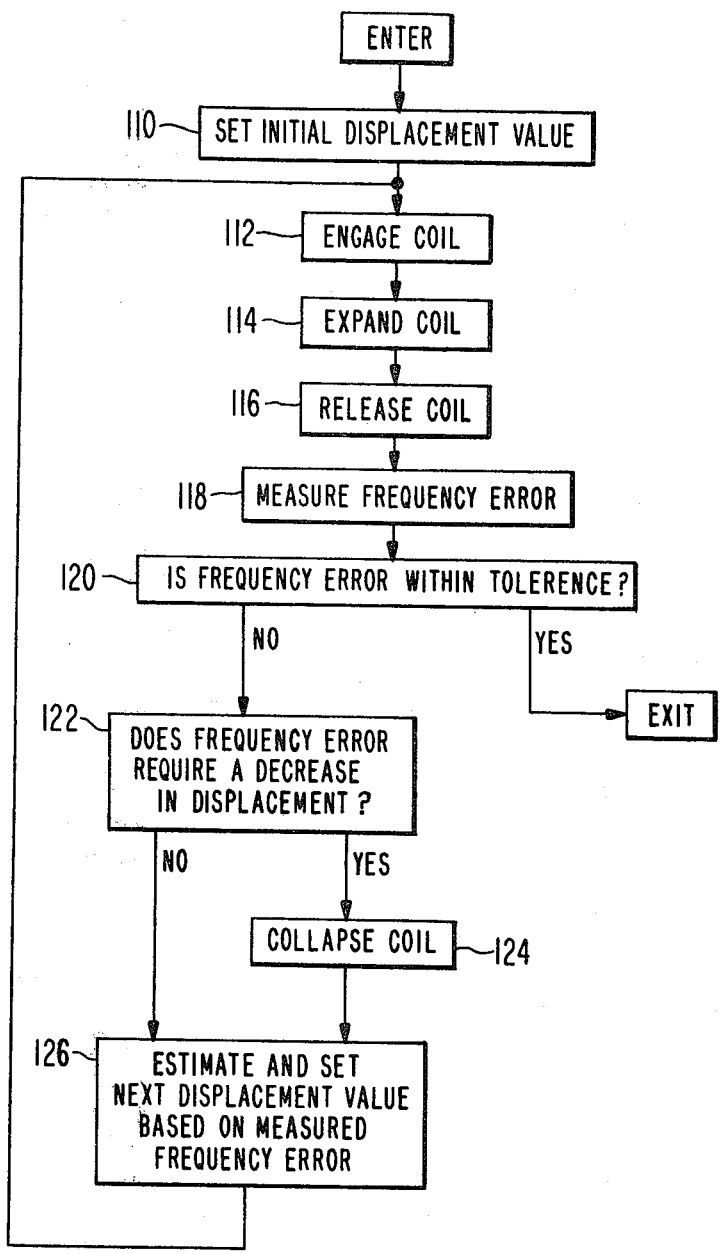
FIG. 6 is a program flow chart of the operation of the system shown in FIG. 5.

A flow chart illustrating a program under which controller 84 operates for adjusting inductor 10 is shown in FIG. 6.

The program is entered at step 110 where an initial displacement value for the first push rod (measured from the surface of the circuit board) is set in memory. Then, the inductor is mechanically engaged by the two push rods at step 112 and expanded at step 114 to the displacement value as defined in memory. The initial displacement provides a coarse adjustment of the inductor 10 to an approximate nominal inductance value. The inductor is then mechanically released and the frequency response of the tuned circuit is measured. A decision at step 120 is performed to determine whether or not the frequency error is within tolerance. If so, the push rods 40 and 46 are disengaged from the inductor 10 and circuit board 22, and the program is exited.

If the frequency error is not within tolerance, a determination is made at step 122 as to whether an increase or decrease in displacement is required in order to reduce the measured frequency error. If the measured frequency error requires an increase in displacement, then the coil is further expanded. The measured frequency error provides some indication as to what incremental displacement is necessary in order to reach the displacement corresponding to the proper tuned position. A variety of methods may be used to determine the relationship between incremental displacement and measured frequency error. For example, a successive approximation approach may be used which provides for successively smaller displacement steps as the frequency error is reduced. As another example, the characteristic curves (FIG. 3) may be used to calculate the incremental displacement needed to reach a final tuned position in substantially one step. First, the measured frequency error is correlated to an inductance error. Then, from the characteristics of the unstressed inductor (curve 36 in FIG. 3) the inductance error is correlated to a displacement error, which latter value is approximately the incremental displacement required. As a third example, the incremental displacement may be obtained from a look-up table stored in memory containing empirically derived values of incremental displacement for each value of frequency error.

In any event, the initial displacement which was initially set to a nominal value is changed to a value closer to the desired value. The inductor is again mechanically engaged by the two push rods at step 113 further expanding it to the new displacement value as defined in memory and then releasing it at step 116. The frequency response error is again measured at step 118, and compared to allowable tolerances at step 120. If the frequency error is still not within tolerance, the program repeats again, setting a new displacement value in memory based on the measured frequency error and further expanding the inductor more closely towards the desired setting. After progressively expanding the inductor, when the frequency error is within tolerance, the push rods 40 and 46 are disengaged from the inductor 10 and circuit board 22, and the program is exited.

If the initial displacement was so great that the measured frequency error required a decrease in displacement, then the coil is collapsed completely in step 124. A new initial displacement based on the measured frequency error is set in memory at step 126 and the program is repeated until the frequency response error of the tuned circuit is within tolerance.

The inductor 10 may alternatively be adjusted by a program that adjusts the inductance of inductor 10 to a tuned position while the inductor is engaged by the push rods and in a stressed condition. Releasing the inductor at that point to an unstressed state would result in an increase in inductance which would detune the tuned circuit. However, the characteristic hysteresis curves of FIG. 3 (previously stored in the microprocessor controller memory) can be used to compensate for the unwanted hysteresis return. After the circuit is tuned with the inductor in a stressed condition, the inductor is expanded to a new position such that when released, the inductor returns to the desired position.

The technique of tuning the coil 10 in a stressed condition is likely to reduce the time required for an automatic control system to adjust the frequency response of a tuned circuit. However, such technique relies on the repeatability of the hysteresis characteristics. Therefore, it is preferable to provide a preliminary stress cycle (expansion and collapse of the inductor) before beginning to tune the circuit in order to improve repeatability of inductor characteristics from one expansion to the next for the same inductor. Furthermore, it is preferable that the inductor be attached to the circuit board before the preliminary stress cycle with the bottom of the respective helical coils 12 and 14 seated snugly against the surface of the board in order to improve the repeatability of the inductance versus displacement characteristics from one inductor to the next.

Figure 7:
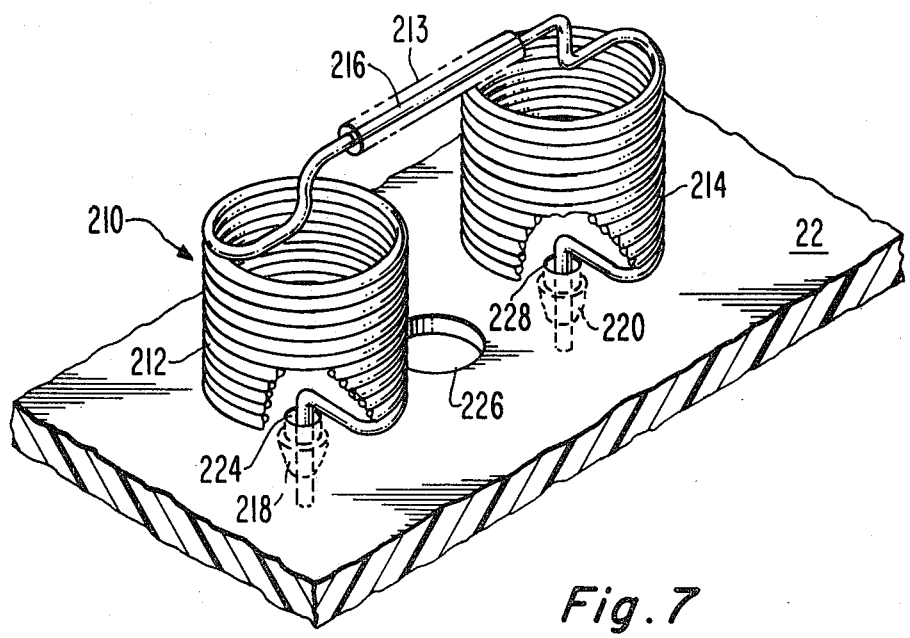
FIG. 7 is an alternate embodiment of an inductor suitable for use with the present invention.

FIG. 7 shows an alternate embodiment of a coil 210 embodying the present invention. In this embodiment, the connecting member 216 connects to the first and second helical coils 212 and 214 at a point along their respective axes. The points of connection 224 and 220 between the circuit board and the helical coils are also along their respective axis. Therefore, as the coil is extended by mechanically engaging the connecting portion 216, the tendency for the connecting member 216 to twist in a plane parallel to the circuit board 22 is reduced.

Although the connecting portion 216 in the embodiment shown is integral to a single piece of wire forming the entire coil 210, it will be understood that such connecting portion may also be a conductive clamp between two helical coils, or may also be reinforced by conductive or non-conductive material such as a reinforcing sleeve 213 placed over the connecting portion 216 before the helical coils are formed so as to reduce the amount of deformation of the connecting portion under mechanical stress. The symmetrical embodiments shown are also particularly suitable for automatic insertion equipment because the insertion forces tend to be distributed equally. Also, although the embodiment shown provides an axis of extension substantially perpendicular to the circuit board on which the coil is mounted, it will be understood that the axis of extension may be at an obtuse angle or angles to the board. Furthermore, while the embodiments shown indicate that the coil sections are substantially equal in size and shape, it will be understood that asymmetrical designs are also possible, so long as the connecting portion is substantially maintained in its position along an axis between two extensible portions and so long as the two extensible sections support the connecting section along such axis.

What is claimed is:

1. In a tuned circuit of the type including an inductor mounted on a circuit board, wherein said inductor comprises a conductor having respective first and second ends connected to respective first and second points on said circuit board, said conductor having first, second and third portions, said first portion including a section in the shape of an extensible coil extending from said circuit board, said third portion including an extensible section extending from said circuit board, said second portion being connected between said first and second portions, and wherein said circuit board is formed with an opening therethrough located below said second portion, an apparatus for adjusting said inductor comprising:
- first means extending through said opening in said circuit board for exerting mechanical force against said second portion of said inductor;
- second means for exerting mechanical force against said second portion extending in a direction opposite to that of said first means; and
- control means connected to said first and second means for controlling said first and second means to simultaneously extend or compress said first and third portions.

2. An apparatus in accordance with claim 1 wherein one of said first and second means provides a substantially constant force on said second portion, and the other of said first and second means is responsive to control pulses for selectively advancing or retracting said other means.

3. An apparatus in accordance with claim 1 wherein said first means comprises:
- a push rod having first and second ends, said first end extending through said opening in said circuit board;
- screw advance means connected to the second end of said first push rod for converting rotational motion to linear motion; and
- a stepping motor responsive to control pulses for providing rotational motion to said screw advance means.

4. An apparatus according to claim 3 wherein said second means comprises:
- a second push rod having first and second ends, said first end extending along the same axis as said first push rod; and
- a pneumatic air cylinder connected to the second end of said second push rod, said pneumatic air cylinder being responsive to a control signal for selectively activating said pneumatic air cylinder to advance said second push rod so as to provide a substantially constant force on said second portion of said inductor.

5. An apparatus according to claim 3 wherein the first end of said first push rod includes a first notch for receiving said second portion of said inductor.

6. An apparatus according to claim 4 wherein the first end of said second push rod includes a second notch for receiving said second portion of said inductor.

* * * * *